United States Patent
Ahn et al.

(10) Patent No.: US 9,401,446 B2
(45) Date of Patent: Jul. 26, 2016

(54) SILICON SOLAR CELL AND METHOD OF MANUFACTURING THE SAME

(75) Inventors: Junyong Ahn, Seoul (KR); Gyeayoung Kwag, Seoul (KR); Juhwa Cheong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 106 days.

(21) Appl. No.: 12/276,592

(22) Filed: Nov. 24, 2008

(65) Prior Publication Data

US 2010/0108129 A1  May 6, 2010

(30) Foreign Application Priority Data

Nov. 4, 2008 (KR) .................. 10-2008-0108669

(51) Int. Cl.
  *H01L 31/00* (2006.01)
  *H01L 21/00* (2006.01)
  *H01L 31/068* (2012.01)
  *H01L 31/18* (2006.01)

(52) U.S. Cl.
  CPC .......... *H01L 31/068* (2013.01); *H01L 31/1804* (2013.01); *Y02E 10/547* (2013.01); *Y02P 70/521* (2015.11)

(58) Field of Classification Search
  CPC .. H01L 31/068; H01L 31/1804; Y02E 10/547
  USPC ............... 136/255; 438/72; 257/E21.158
  See application file for complete search history.

(56) References Cited

U.S. PATENT DOCUMENTS

| | | | | | |
|---|---|---|---|---|---|
| 4,359,487 | A | * | 11/1982 | Schneider | 427/75 |
| 4,681,657 | A | | 7/1987 | Hwang et al. | |
| 5,151,377 | A | * | 9/1992 | Hanoka et al. | 438/98 |
| 5,871,591 | A | * | 2/1999 | Ruby et al. | 136/261 |
| 5,928,438 | A | * | 7/1999 | Salami et al. | 136/255 |
| 6,091,021 | A | | 7/2000 | Ruby et al. | 136/261 |
| 6,147,297 | A | * | 11/2000 | Wettling et al. | 136/256 |
| 2004/0003837 | A1 | * | 1/2004 | Mauk | 136/244 |

FOREIGN PATENT DOCUMENTS

| | | |
|---|---|---|
| CN | 101022140 | 8/2007 |
| EP | 2 323 173 A2 | 5/2011 |

(Continued)

OTHER PUBLICATIONS

Muramatsu, Shinichi et al., JP10261810 A. Solar Cell and Manufacture Thereof, English abstract, Sep. 29, 1998.*

(Continued)

*Primary Examiner* — Tamir Ayad
(74) *Attorney, Agent, or Firm* — KED & Associates, LLP

(57) ABSTRACT

A silicon solar cell and a method of manufacturing the same are disclosed. The silicon solar cell includes a silicon semiconductor substrate doped with first conductive impurities, an emitter layer doped with second conductive impurities having polarities opposite polarities of the first conductive impurities on the substrate, an anti-reflective layer on an entire surface of the substrate, an upper electrode that passes through the anti-reflective layer and is connected to the emitter layer, and a lower electrode connected to a lower portion of the substrate. The emitter layer includes a first emitter layer heavily doped with the second conductive impurities and a second emitter layer lightly doped with the second conductive impurities. A surface resistance of the second emitter layer is 100 Ohm/sq to 120 Ohm/sq.

10 Claims, 7 Drawing Sheets

(56) References Cited

FOREIGN PATENT DOCUMENTS

| | | | | |
|---|---|---|---|---|
| JP | 10261810 A | * | 9/1998 | ............ H01L 31/04 |
| KR | 10-2002-0049718 A | | 6/2002 | |
| KR | 10-2002-0082094 A | | 10/2002 | |
| KR | 10-2007-0043157 A | | 4/2007 | |
| KR | 10-2007-0071060 | | 7/2007 | |
| KR | 10-2007-0106818 | | 11/2007 | |
| WO | WO 97/13280 A1 | | 4/1997 | |
| WO | WO 2009/013307 | | 1/2009 | |
| WO | WO 2010/010462 | | 1/2010 | |
| WO | WO 2010/027232 A2 | | 3/2010 | |

OTHER PUBLICATIONS

PCT International Search Report dated Jul. 31, 2009.

Korean Office Action dated Aug. 2, 2010 issued in Application No. 10-2008-0108669.

Chinese Office Action dated Apr. 20, 2011 for Application 200880118116.8 and English language translation.

Korean Office Action dated Nov. 24, 2010 for Application Sep. 5, 2010-053234453.

Extended European Search Report for Application 08876945.0 dated May 27, 2013.

Szlufcik et al.; "Simple integral screenprinting process for selective emitter polycrystalline silicon solar cells" dated Sep. 23, 1991; Applied Physics Letters; New York, U.S.

Einhaus et al.; "Optimisation of a selective emitter process for multicrystalline silicon solar cells to meet industrial requirements" dated Jun. 30, 1997; 14$^{th}$European Photovoltaic Solar Energy Conference; Barcelona, Spain.

European Office Action for Application 08 876 945.0 dated Aug. 18, 2015.

Haverkamp et al.; "Minimizing the Electrical Losses on the Front Side: Development of a Selective Emitter Process from a Single Diffusion;" 2008 33$^{rd}$ IEEE Photovoltaic Specialists Conference, May 11, 2008- May 16, 2008; pp. 1-4 ISSN: 0160-8371, DOI: 10.1109/PVSC.2008.4922443.; ISN: 978-1-42-441640-0.

Chinese Office Action dated Jun. 2, 2016 issued in Application No. 201510092999.1 (with English Translation).

* cited by examiner

SILICON SOLAR CELL AND METHOD OF MANUFACTURING THE SAME

This application claims the benefit of Korean Patent Application No. 10-2008-0108669 filed on Nov. 4, 2008, which is hereby incorporated by reference.

BACKGROUND

1. Field

Exemplary embodiments relate to a silicon solar cell having a selective emitter structure and a method of manufacturing the same.

2. Description of the Background Art

Recently, as existing energy sources such as petroleum and coal are expected to be depleted, interests in alternative energy sources for replacing the existing energy sources are increasing. Among the alternative energy sources, a solar cell has been particularly spotlighted because the solar cell has abundant energy sources and does not cause environmental pollution.

The solar cell is classified into a solar heat cell that generates a vapor required to rotate a turbine using a solar heat, and a solar light cell that converts photons into electric energy using the properties of a semiconductor. Generally, the solar cell means the solar light cell.

The solar cell is divided into a silicon solar cell, a compound semiconductor solar cell, and a tandem solar cell depending on a raw material. The silicon solar cell has been mainly used in a solar cell market.

FIG. 1 is a cross-sectional view schematically showing a structure of a related art silicon solar cell. As shown in FIG. 1, the silicon solar cell includes a substrate 101 formed of a p-type silicon semiconductor and an emitter layer 102 formed of an n-type silicon semiconductor. A p-n junction similar to a diode is formed at an interface of the substrate 101 and the emitter layer 102.

When solar light is incident on the silicon solar cell having the above-described structure, electrons and holes are generated in a silicon semiconductor doped with impurities by a photovoltaic effect. The electrons are generated as a majority carrier in the emitter layer 102 formed of the n-type silicon semiconductor, and the holes are generated as a majority carrier in the substrate 101 formed of the p-type silicon semiconductor. The electrons and the holes generated by the photovoltaic effect are respectively drawn toward the n-type silicon semiconductor and the p-type silicon semiconductor and respectively move to an electrode 103 connected to an upper portion of the emitter layer 102 and an electrode 104 connected to a lower portion of the substrate 101. A current flows by connecting the electrodes 103 and 104 using electric wires.

Recently, in order to reduce a contact resistance between the electrode 103 and the emitter layer 102, a region of the emitter layer 102 connected to the electrode 103 is formed as a heavily doped region, and a region of the emitter layer 102, which is not connected to the electrode 103, is formed as a lightly doped region. Hence, carrier lifetime is improved. Such a structure is called a selective emitter structure.

The selective emitter structure greatly contributes to the efficiency of the silicon solar cell by reducing the contact resistance between the electrode 103 and the emitter layer 102. However, a process for manufacturing the silicon solar cell having the selective emitter structure is complicated and requires much expense.

SUMMARY

In one aspect, a method of manufacturing a silicon solar cell using a screen printing method comprises providing a silicon semiconductor substrate doped with first conductive impurities, forming an emitter layer doped with second conductive impurities on the silicon semiconductor substrate, the second conductive impurities having polarities opposite polarities of the first conductive impurities, forming an etching mask pattern using the screen printing method at a position where an upper electrode on the emitter layer is connected to the emitter layer, performing an etch-back process on the emitter layer using the etching mask pattern as a mask, removing the etching mask pattern remaining after the etch-back process is performed, forming an anti-reflective layer on an entire surface of the silicon semiconductor substrate, allowing the upper electrode to pass through the anti-reflective layer and connecting the upper electrode to the emitter layer at a formation position of the upper electrode, and connecting a lower electrode to a lower portion of the silicon semiconductor substrate.

In another aspect, a silicon solar cell comprises a silicon semiconductor substrate doped with first conductive impurities, an emitter layer doped with second conductive impurities on the silicon semiconductor substrate, the second conductive impurities having polarities opposite polarities of the first conductive impurities, an anti-reflective layer on an entire surface of the silicon semiconductor substrate, an upper electrode that passes through the anti-reflective layer and is connected to the emitter layer, and a lower electrode connected to a lower portion of the silicon semiconductor substrate, wherein the emitter layer includes a first emitter layer heavily doped with the second conductive impurities and a second emitter layer lightly doped with the second conductive impurities, wherein a surface resistance of the second emitter layer is within the range of 100 Ohm/sq to 120 Ohm/sq.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DETAILED DESCRIPTION

Reference will now be made in detail embodiments of the invention examples of which are illustrated in the accompanying drawings.

FIGS. 2 to 7 are cross-sectional views sequentially illustrating a method of manufacturing a silicon solar cell using a screen printing method according to an exemplary embodiment.

Figure 1:
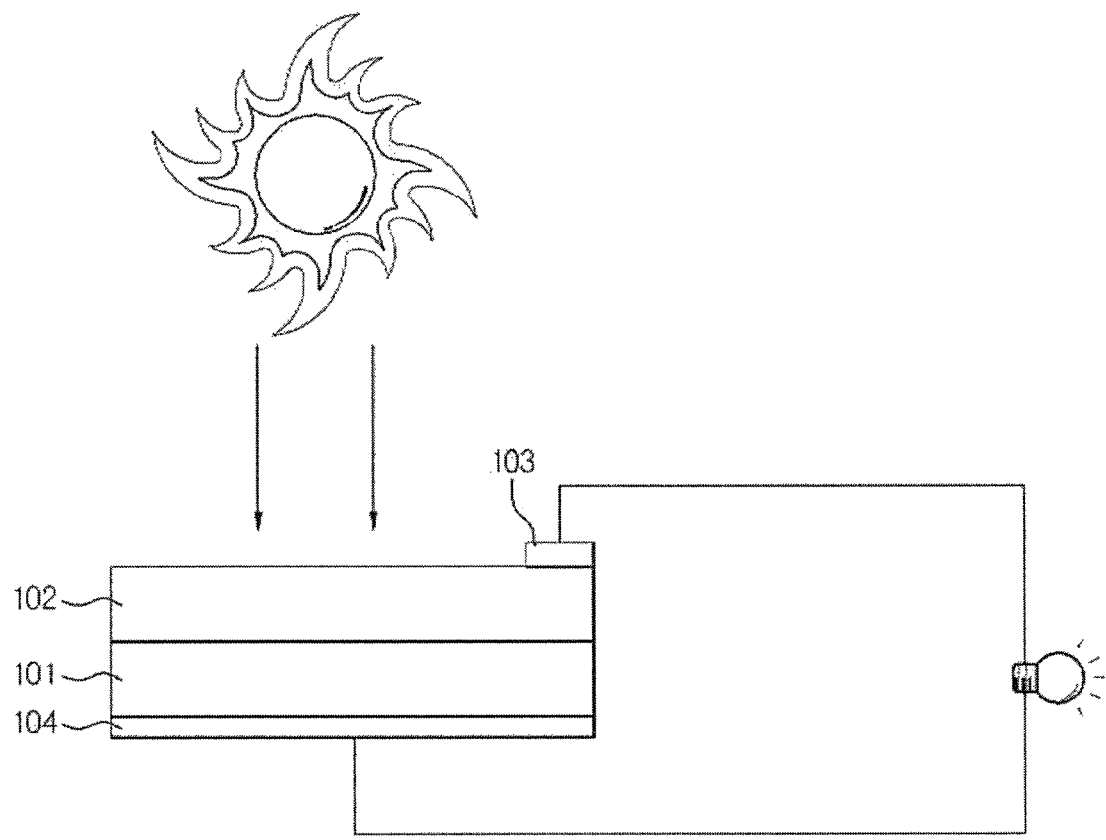
FIG. 1 is a cross-sectional view schematically showing a structure of a related art silicon solar cell.
Figure 2:
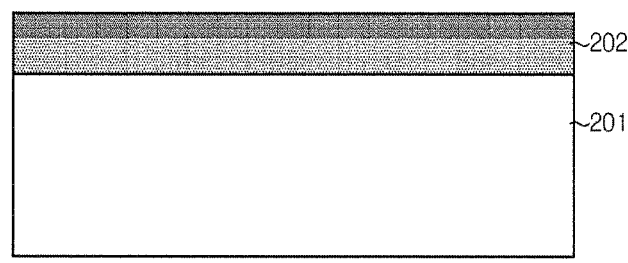
FIGS. 2 to 7 are cross-sectional views sequentially illustrating a method of manufacturing a silicon solar cell according to an exemplary embodiment using a screen printing method.

As shown in FIG. 2, a substrate 201 formed of a silicon semiconductor doped with first conductive impurities is provided and is loaded on a diffusion furnace. The substrate 201 is a single crystal, polycrystal or amorphous silicon semiconductor substrate and is doped with p-type impurities such as B, Ga and In belonging to a group III element. Then, n-type impurity source such as P, As, Sb belonging to a group V element and an oxygen gas are injected into the diffusion furnace to generate a thermal oxidation reaction. Hence, an oxide layer containing the n-type impurities with a constant thickness is formed on an upper surface of the substrate 201.

The n-type impurities inside the oxide layer are driven into the substrate 201 by raising a temperature inside the diffusion furnace at 800 to 850° C. The above process is performed for 30 to 60 sec so as to drive a sufficient amount of n-type impurities into the substrate 201. Hence, an emitter layer 202 formed of an n-type silicon semiconductor layer with a constant thickness is formed on the substrate 201 by diffusing the n-type impurities into the inside of the substrate 201 through the surface of the substrate 201.

The n-type impurities injected into the emitter layer 202 have a maximum concentration value on the surface of the emitter layer 202. The n-type impurities have a decreasing concentration value depending on Gaussian distribution or an error function as they are driven into the inside of the emitter layer 202. Because process conditions are controlled so as to diffuse a sufficient amount of n-type impurities into the substrate 201 during the diffusion process, an n-type doped dead layer, which has a concentration equal to or larger than a solid solubility, exists in an uppermost portion of the emitter layer 202.

Figure 8:
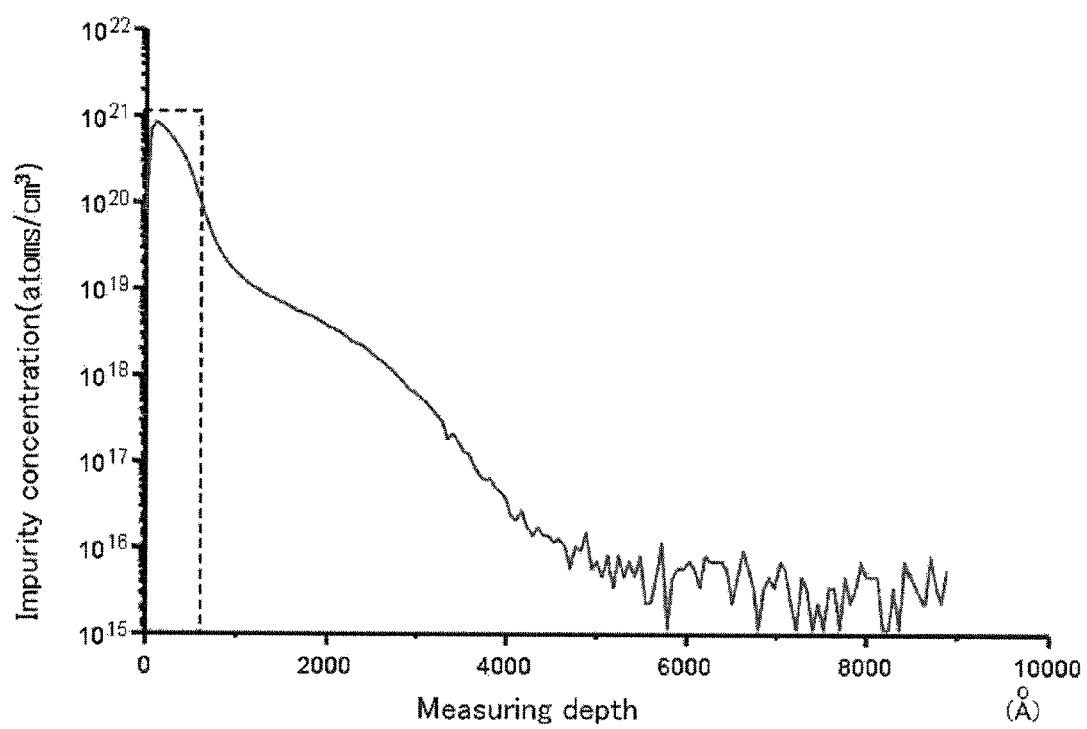
FIG. 8 is a graph, after a process for distributing n-type impurities is completed, showing a concentration of the n-type impurities doped from the surface of an emitter layer to a substrate.

FIG. 8 is a graph, after a process for distributing the n-type impurities is completed, showing a concentration of the n-type impurities doped from the surface of the emitter layer 202 to the substrate 201. In the graph, a traverse axis denotes a depth of a measuring position of a n-type impurity concentration based on the surface of the emitter layer 202, and a longitudinal axis denotes the n-type impurity concentration at the measuring position.

As shown in FIG. 8, the n-type impurities have a maximum concentration value near the surface of the emitter layer 202. The n-type impurities have a decreasing concentration value as they go toward the substrate 201. An n-type doped dead layer having a concentration equal to or larger than a solid solubility inside the silicon semiconductor exists near the surface of the emitter layer 202, i.e., in the box area of FIG. 8. A concentration of the n-type impurities contained in the dead layer depends on a material of the n-type impurities. If the n-type impurities is phosphor (P), an n-type impurity concentration is equal to or larger than $10^{20}$ atom/cm$^3$.

The exemplary embodiment described only an example of the method for forming the emitter layer 202, and thus, the method for forming the emitter layer 202 may be variously changed.

Figure 3:
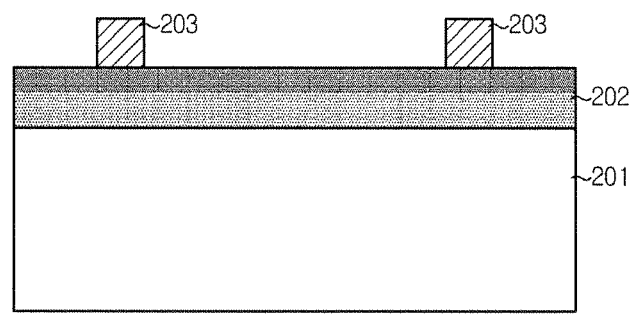

After the emitter layer 202 is formed through the above-described process, as shown in FIG. 3, an etching mask pattern 203 is formed on an upper portion of the n-type doped emitter layer 202 at a connection position of the n-type doped emitter layer 202 and an upper electrode 205 (refer to FIG. 7) using the screen printing method. More specifically, a printing mask (not shown) is positioned on the upper portion of the emitter layer 202. The printing mask has an opening pattern at a formation position of the etching mask pattern 203.

Then, while a screen printer (not shown) moves in a regular direction, a paste for the etching mask pattern 203 is squeezed into the opening pattern to fill the opening pattern. Afterwards, the printing mask is removed from the emitter layer 202 to form the etching mask pattern 203 on the emitter layer 202. In the exemplary embodiment, a formation method of the etching mask pattern 203 is not limited to the screen printing method.

The paste for the etching mask pattern 203 may include a glass frit paste including inorganic material particles, an organic solvent, and a resin. The glass frit paste may include ethyl cellulose-based resin, acrylate-based resin, or resin material having molecular weight equal to or larger than 100, which is hardly soluble in water, as the resin, so as to maintain a uniform pattern and increase printing properties. The glass frit paste may include terpineol, butyl carbitol, butyl carbitol acetate, and the like, as the organic solvent. The glass frit paste may include any one or a mixture of $SiO_2$—PbO-based particles, $SiO_2$—PbO—$B_2O_3$-based particles, and $Bi_2O_3$—$B_2O_3$—$SiO_2$-based particles as the inorganic material particles depending on the use.

After the etching mask pattern 203 is formed, a fill factor between the inorganic material particles has to be large so that an etching of the emitter layer 202 positioned under the etching mask pattern 203 is reduced during an etch-back process. Accordingly, a diameter of the inorganic material particles may be 0.1 μm to 10 μm, or 0.5 μm to 3 μm. The glass frit paste may further include a metal oxide formed of any one or a mixture of $TiO_2$, $P_2O_5$, BaO, ZnO, and $Al_2O_3$ so as to control physical properties such as adhesive properties, printing properties and oxide resistance.

As an alternative proposal, the paste for the etching mask pattern 203 may include any one or a mixture of a soldering material, silicon on glass (SOG), and silica slurry. The silica slurry includes silica particles, an organic solvent, a binder, and a resin. In the exemplary embodiment, the paste for the etching mask pattern 203 is not limited thereto.

Figure 4:
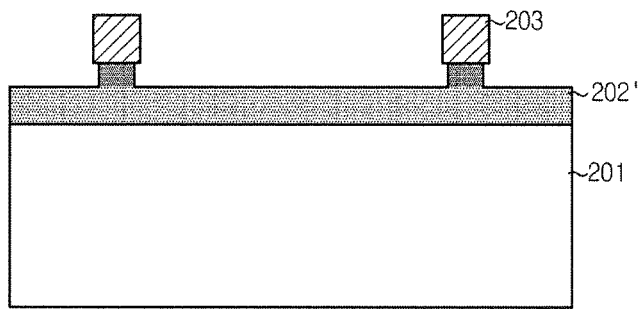

As shown in FIG. 4, a mask process is performed on the etching mask pattern 203 on the emitter layer 202, and an etch-back process is performed on the emitter layer 202 to form a selective emitter layer 202'. In the etch-back process of the emitter layer 202, only an uppermost portion of the emitter layer 202 in which the etching mask pattern 203 does not exist is etched to have a constant etching depth. Accordingly, a heavily doped region of the emitter layer 202 can be selectively removed from only a portion on which solar light is incident.

The n-type impurities are heavily doped at only a position where the selective emitter layer 202' is connected to the upper electrode 205. Accordingly, ohmic contact can be achieved by improving contact characteristic of the upper electrode 205. Because the heavily doped n-type region is removed from the surface of the emitter layer 202 on which solar light is incident, a reduction in the efficiency of the silicon solar cell caused by a reduction in carrier lifetime can be prevented.

A wet etchant and a dry etchant may be used in the etch-back process of the emitter layer 202. A selective wet etchant may be used so as to secure the stability and reproducibility of the etch-back process.

As an example, in the exemplary embodiment, the emitter layer 202 is etch-backed using a selective wet etchant including $HNO_3$, HF, $CH_3COOH$, and $H_2O$ in a volume ratio of 10:0.1-0.01:1-3:5-10. The selective wet etchant increases an etching speed as a concentration of the impurities injected into the emitter layer 202 increases.

More specifically, when the selective wet etchant is used, the heavily doped region of the emitter layer 202 is etched at an etching speed of 0.08 to 0.12 μm/sec and a lightly doped region of the emitter layer 202 is etched at an etching speed of 0.01 to 0.03 μm/sec. When the etch-back process is performed using the selective wet etchant, the stability and reproducibility of the etch-back process can be secured by selectively removing the uppermost portion of the emitter layer 202 corresponding to the heavily doped region in an initial stage of the etch-back process.

It is a matter of course that the etching speed using the selective wet etchant may partially change by a volume ratio of an etchant composition, a kind and a concentration of diffused impurities, and the like. Further, an alkali wet etchant such as KOH or a dry etchant such as $CF_4$ plasma may be used in the etch-back process of the emitter layer 202.

Figure 5:
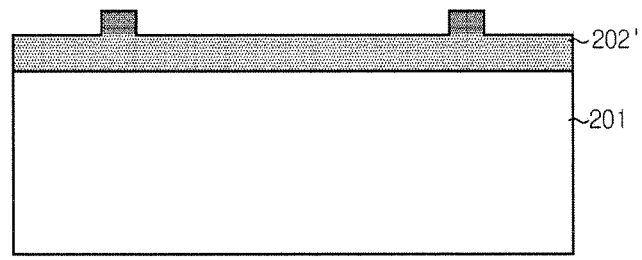
Figure 6:
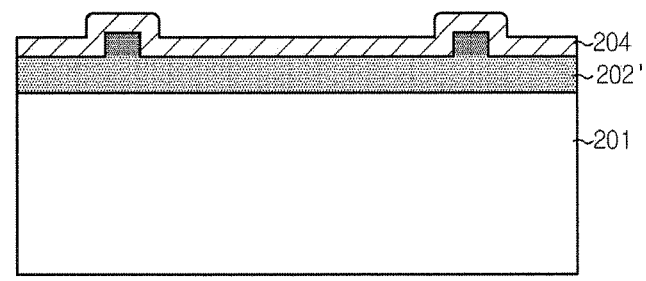

After the etch-back process of the emitter layer 202 is completed, as shown in FIG. 5, the etching mask pattern 203 remaining in the surface of the substrate 201 is removed to form the selective emitter layer 202'. Then, as shown in FIG. 6, an anti-reflective layer 204 is formed on the selective emitter layer 202'.

The anti-reflective layer 204 includes a silicon nitride layer, a hydrogenated silicon nitride layer, a silicon oxide layer, a silicon nitride-oxide layer, or a single layer or two or more layers selected from the group consisting of $MgF_2$, ZnS, $MgF_2$, $TiO_2$ and $CeO_2$. The anti-reflective layer 204 is formed using a vacuum deposition method, a chemical vapor deposition (CVD) method, a spin coating method, a screen printing method, or a spray coating method. However, in the exemplary embodiment, the formation method of the anti-reflective layer 204 is not limited thereto.

Figure 7:
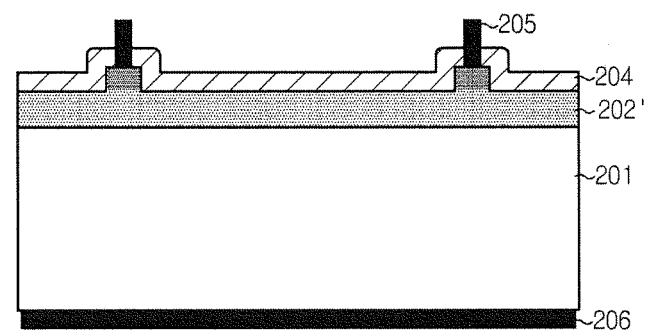

After the formation of the anti-reflective layer 204 is completed, as shown in FIG. 7, the upper electrode 205 and a lower electrode 206 are respectively connected to an upper portion of the selective emitter layer 202' and a lower portion of the substrate 201. It is possible to manufacture the upper electrode 205 and the lower electrode 206 using known technologies. Preferably, the upper electrode 205 and the lower electrode 206 may be formed using the screen printing method. More specifically, the upper electrode 205 is formed by performing a screen printing process on a paste for the upper electrode 205 including silver (Ag), a glass frit, a binder, and the like, on the upper portion of the selective emitter layer 202' and then performing a thermal process on the screen-printed paste for the upper electrode 205. When the thermal process is performed, the upper electrode 205 passes through the anti-reflective layer 204 by a punch-through phenomenon and is connected to the selective emitter layer 202'.

Similar to the formation of the upper electrode 205, the lower electrode 206 is formed by performing a screen printing process on a paste for the lower electrode 206 including aluminum (Al), quartz silica, a binder, and the like, on the lower portion of the substrate 201 and then performing a thermal process on the screen-printed paste for the lower electrode 206. Because aluminum is diffused into the lower portion of the substrate 201 during the thermal process of the lower electrode 206, a back surface field layer (not shown) may be formed at an interface between the lower electrode 206 and the substrate 201. The back surface field layer can prevent carriers from moving to the lower portion of the substrate 201 and from recombining. If the recombination of carriers is prevented, an open-circuit voltage and a fill factor increase and the conversion efficiency of the silicon solar cell is improved.

The upper electrode 205 and the lower electrode 206 may be formed using a general photolithographic etching process and a metal deposition process in addition to the screen printing method. However, in the exemplary embodiment, the formatting method of the upper electrode 205 and the lower electrode is not limited thereto.

In the exemplary embodiment, because an impurity doping process is once performed at a high temperature, the impurities can be prevented from being activated inside the substrate 201. Further, because the etching mask pattern 203 is formed using the screen printing method, the process is simple and the manufacturing cost can be reduced.

Because the etching mask pattern 203 is simply formed through the screen printing method using a paste material, a vacuum deposition equipment or a high temperature furnace is not necessary. Further, because the selective wet etchant is used in the etch-back process of the emitter layer 202, the stability and reproducibility of the etch-back process can be secured.

Figure 9A:
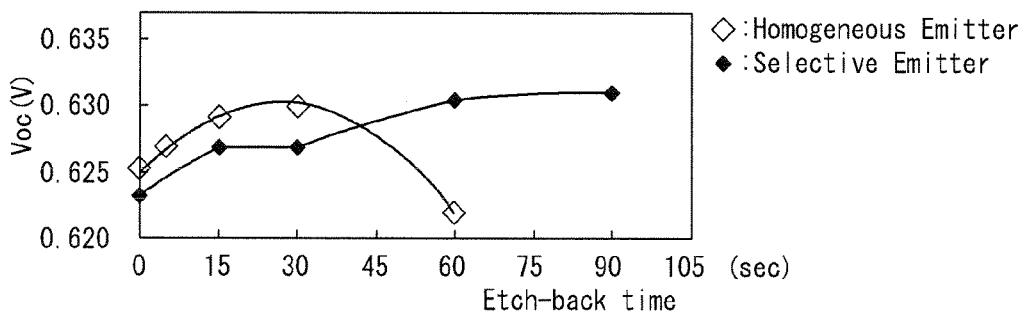
FIGS. 9A to 9C are diagrams comparing output characteristics of the silicon solar cell according to the exemplary embodiment having a selective emitter structure with output characteristics of a silicon solar cell having a homogeneous emitter structure.
Figure 9B:
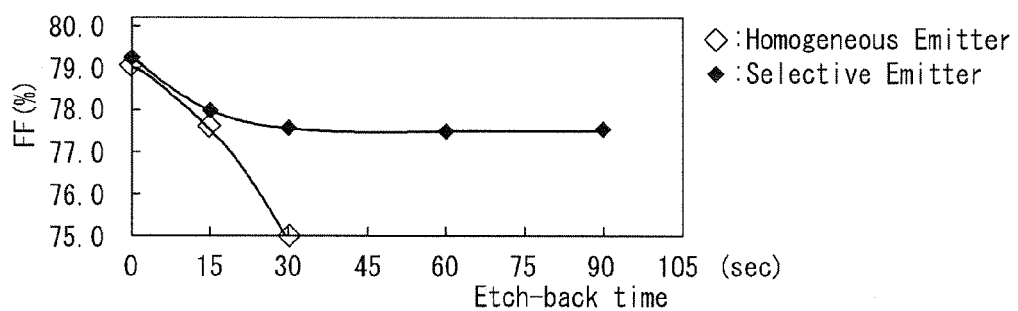
Figure 9C:
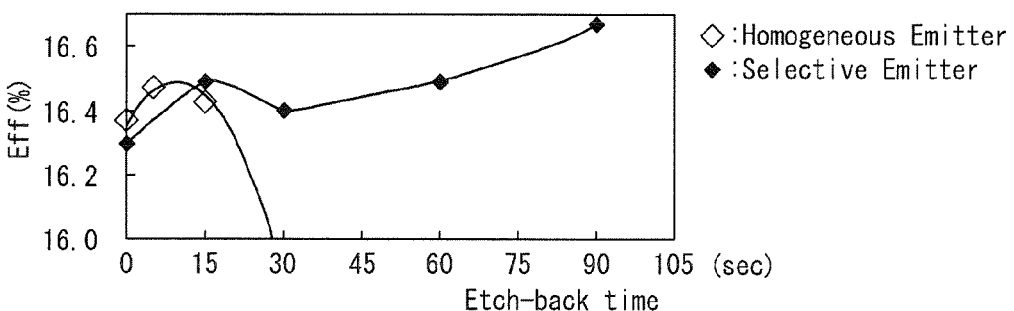

FIGS. 9A to 9C are diagrams comparing output characteristics of the silicon solar cell according to the exemplary embodiment having a selective emitter structure with output characteristics of a silicon solar cell having a homogeneous emitter structure.

The following Table 1 indicates output characteristics of the silicon solar cell according to the exemplary embodiment having the selective emitter structure depending on time required in the etch-back process.

TABLE 1

| Etch-back time (sec) | $R_{sh}$ (Ohm/sq.) | $J_{sc}$ (mA/cm$^2$) | $V_{oc}$ (V) | Fill factor (%) | $E_{ff}$ (%) |
|---|---|---|---|---|---|
| 0 | 50 | 33.1 | 0.624 | 79.1 | 16.3 |
| 15 | 65 | 33.7 | 0.627 | 78.0 | 16.5 |
| 30 | 80 | 33.7 | 0.627 | 77.6 | 16.4 |
| 60 | 100 | 33.8 | 0.630 | 77.5 | 16.5 |
| 90 | 120 | 34.1 | 0.631 | 77.5 | 16.7 |

The output characteristics of the silicon solar cell are evaluated by measuring a current-voltage curve of the silicon solar cell. On the current-voltage curve, when a value Ip×Vp obtained by multiplying an output current Ip by an output voltage Vp is at a maximum, the obtained value is indicated as a maximum output Pm. A value obtained by dividing the maximum output Pm by a total solar energy (S×I: S is an area of an element, and I is an intensity of light irradiated to the silicon solar cell) incident on the silicon solar cell is defined as conversion efficiency η. A short-circuit current Isc or an open-circuit voltage Voc has to increase or a fill factor (FF) has to increase so as to increase the conversion efficiency η. The short-circuit current Isc is defined as a current value when the voltage is 0 on the current-voltage curve, and the open voltage Voc is defined as a voltage value when the current is 0 on the current-voltage curve. The fill factor (FF) is defined as a ratio of a solar cell's actual power to its power if both current and voltage are at their maxima.

Because the uppermost portion of the emitter layer is etched to have the constant etching depth in the etch-back process, a depth and the impurity concentration of the emitter layer decrease and a surface resistance $R_{sh}$ of the emitter layer increases as time required in the etch-back process increases.

As the surface resistance $R_{sh}$ of the emitter layer increases, surface combination decreases. Hence, because collection efficiency of carriers generated by narrow-band light increases, a short-circuit current density $J_{sc}$ and an open-circuit voltage Voc increase, and the conversion efficiency increases.

Although the short-circuit current density $J_{sc}$ and the open-circuit voltage Voc increase as the surface resistance $R_{sh}$ of the emitter layer increases, the fill factor even decreases. The fill factor is defined as a ratio of a value obtained by multiplying the short-circuit current Isc by the open-circuit voltage Voc to a value obtained by multiplying the maximum output current by the maximum output voltage.

As indicated in Table 1, when the etch-back time increases to 90 sec, the surface resistance $R_{sh}$ increases from 50 Ohm/sq to 120 Ohm/sq because the impurity concentration decreases. Further, when the etch-back time increases to 90 sec, the short-circuit current density $J_{sc}$ increases from 33.1 mA/cd$^2$ to 34.1 mA/cm and the open-circuit voltage Voc increases from 0.624V to 0.631V except the fill factor because the collection efficiency of carriers increases.

FIG. 9A illustrates changes in the open-circuit voltage Voc depending on the etch-back time. As shown in FIG. 9A, in the silicon solar cell having the homogeneous emitter structure, the open-circuit voltage Voc sharply decreases after the passage of the etch-back time of 30 sec. In the silicon solar cell having the selective emitter structure through the etch-back process, the open-circuit voltage Voc continuously increases until the etch-back time reaches 90 sec.

As shown in Table 1 and FIG. 9B illustrating changes in the fill factor (FF) depending on the etch-back time, in the silicon solar cell having the homogeneous emitter structure, when the etch-back time reaches 30 sec, the fill factor sharply decrease to 75%. In the silicon solar cell having the selective emitter structure through the etch-back process, the fill factor slowly decreases over the etch-back time.

The result illustrated in FIGS. 9A and 9B is obtained because only the upper portion of the selective emitter layer connected to the upper electrode 205 is heavily doped and a contact resistance between the upper electrode 205 and the selective emitter layer is hold at a low value in a region having a low surface resistance $R_{sh}$.

As shown in Table 1 and FIG. 9C illustrating changes in the conversion efficiency $E_{ff}$ depending on the etch-back time, in the silicon solar cell having the homogeneous emitter structure, the conversion efficiency $E_{ff}$ sharply decreases after the passage of the etch-back time of 15 sec. When the etch-back time reaches 30 sec, the conversion efficiency $E_{ff}$ decreases to 16.0%. In the silicon solar cell having the selective emitter structure through the etch-back process, the conversion efficiency $E_{ff}$ continuously increases from 16.3% to 16.7% until the etch-back time reaches 90 sec.

In terms of the surface resistance $R_{sh}$ of the emitter layer proportional to the etch-back time, if the surface resistance $R_{sh}$ is within the range of 50 Ohm/sq to 120 Ohm/sq, the silicon solar cell having the selective emitter structure through the etch-back process has the more excellent open-circuit voltage $V_{oc}$, the more excellent fill factor, and the more excellent conversion efficiency than the silicon solar cell having the homogeneous emitter structure.

Furthermore, if the surface resistance $R_{sh}$ is within the range of 100 Ohm/sq to 120 Ohm/sq, the conversion efficiency has a more excellent value of 16.7% and the fill factor has a relatively good value of 77.5%.

Figure 10A:
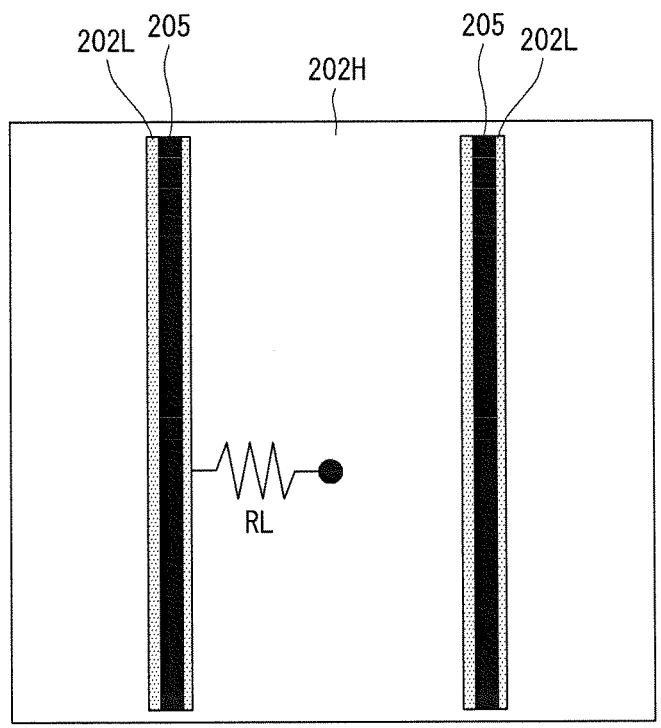
FIG. 10A is a plane view of the silicon solar cell manufactured using the screen printing method in accordance with the method illustrated in FIGS. 2 to 7.

FIG. 10A is a plane view of the silicon solar cell manufactured using the screen printing method in accordance with the method illustrated in FIGS. 2 to 7.

As shown in FIGS. 2 to 7 and FIG. 10A, after the process for forming the emitter layer 202 is performed, the etching mask pattern 203 is formed using the screen printing method. Then, the selective emitter layer 202' is formed by performing the etch-back process on the emitter layer 202, and then the upper electrode 205 is connected to the upper portion of the selective emitter layer 202'.

In the etch-back process of the emitter layer 202, only the uppermost portion of the emitter layer 202 in which the etching mask pattern 203 does not exist is etched to have the constant etching depth. Therefore, the heavily doped region of the emitter layer 202 can be selectively removed from only a portion on which solar light is incident.

As shown in FIG. 10A, only a region 202L of the selective emitter layer 202' connected to the upper electrode 205 is heavily doped with n-type impurities. The heavily doped n-type region 202L is removed from a surface 202H of the selective emitter layer 202' on which solar light is incident.

After the doping process is performed, resistivity depends on diffusion degree of the impurities. Therefore, the heavily doped n-type region 202L (hereinafter, referred to as "low $R_{sh}$ emitter region") of the selective emitter layer 202' connected to the upper electrode 205 has a low surface resistance $R_1'$. The region 202H (hereinafter, referred to as "high $R_{sh}$ emitter region") where the heavily doped n-type region 202L is removed has a high surface resistance $R_1$.

When the selective emitter layer 202' is formed by performing the etch-back process on the emitter layer 202, the low $R_{sh}$ emitter region 202L connected to the upper electrode 205 reduces a contact resistance and a doping concentration of the impurities. Hence, the surface resistance $R_{sh}$ of the selective emitter layer 202' increases, surface recombination decreases, and the short-circuit current density $J_{sc}$ and the open-circuit voltage Voc increase.

However, when the surface resistance $R_{sh}$ increases, the fill factor and the conversion efficiency $E_{ff}$ of the silicon solar cell are reduced in spite of an increase in the short-circuit current density $J_{sc}$ and the open-circuit voltage Voc.

Accordingly, in order to improve the conversion efficiency $E_{ff}$ of the silicon solar cell, a reduction in the fill factor generated when the surface resistance $R_{sh}$ increases has to be solved.

Figure 10B:
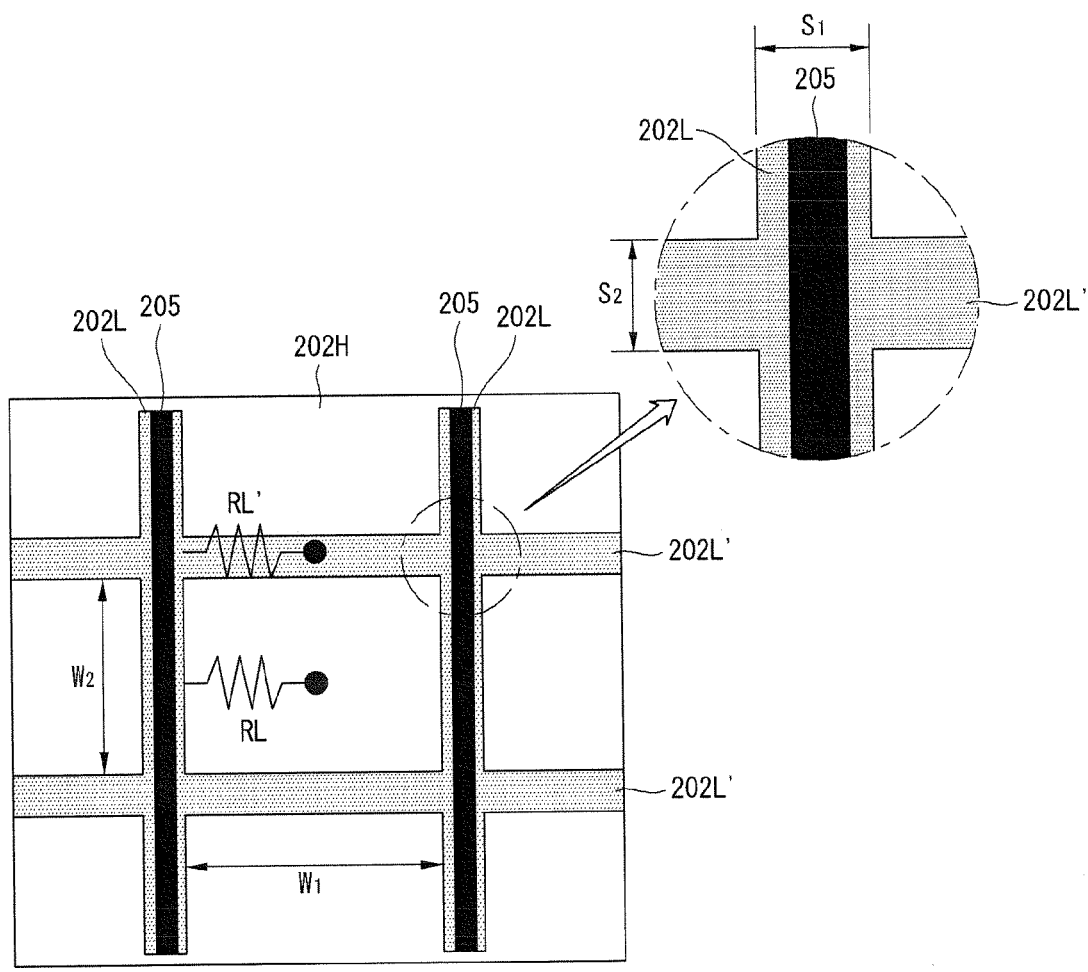
FIG. 10B is a plane view of the silicon solar cell according to the exemplary embodiment in which a selective emitter layer is formed using a lattice-shaped etching mask pattern.

FIG. 10B is a plane view of the silicon solar cell according to the exemplary embodiment in which a selective emitter layer is formed using a lattice-shaped etching mask pattern.

In FIG. 10B, only the etching mask pattern is modified, and the silicon solar cell is formed using the same method as the method illustrated in FIG. 10A without additional process. Therefore, additional cost is not necessary.

As shown in FIGS. 2 to 7 and FIG. 10B, after the process for forming the emitter layer 202 is performed, the lattice-shaped etching mask pattern 203 is formed using the screen printing method. Then, the selective emitter layer 202' having the same lattice pattern as the lattice-shaped etching mask pattern 203 is formed by performing the etch-back process on the emitter layer 202, and then the upper electrode 205 is connected to the upper portion of the selective emitter layer 202'.

As shown in FIG. 10B, the screen printed etching mask pattern 203 is formed in a lattice shape by adding a plurality of lines perpendicular to an existing upper electrode pattern. Hence, the surface resistance $R_{sh}$ can be reduced by additionally forming a low $R_{sh}$ emitter region 202L' in the high $R_{sh}$ emitter region 202H, and a reduction width in the fill factor can efficiently decrease. An optical current can efficiently flow in the low $R_{sh}$ emitter region 202L', When a surface resistance of the high $R_{sh}$ emitter region 202H is R1 and a surface resistance of the low $R_{sh}$ emitter region 202L is R1', $R_1/R_1'$ is larger than 1.

The fill factor can increase by reducing an interval between the lattice-shaped etching mask patterns and increasing a width of the lattice-shaped etching mask pattern. However, the open-circuit voltage $V_{oc}$ and the short-circuit current density $J_{sc}$ can be reduced because of an increase in the size of the low $R_{sh}$ emitter region 202L.

Accordingly, it is advantageous that the interval between the lattice-shaped etching mask patterns and the width of the lattice-shaped etching mask pattern are similar to an interval between patterns of the upper electrode 205 and a width of the upper electrode 205.

According to the research results, when an area of the upper electrode 205 is about 4% of the total area of the silicon solar cell, the maximum efficiency can be obtained.

Accordingly, it is advantageous that the interval between the lattice-shaped etching mask patterns is within the range of 1 to 3 mm, and the width of the lattice-shaped etching mask pattern is within the range of 50 to 200 µm.

In case of using the lattice-shaped etching mask pattern, as shown in FIG. 10B, it is advantageous that an interval W1 between the non-etch backed low $R_{sh}$ emitter regions 202L and an interval W2 between the non-etch backed low $R_{sh}$ emitter regions 202L' are within the range of 1 to 3 mm. Further, it is advantageous that a width S1 of the non-etch backed low $R_{sh}$ emitter region 202L and a width S2 of the non-etch backed low $R_{sh}$ emitter region 202L' are within the range of 50 to 200 µm.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A silicon solar cell comprising:
   a silicon semiconductor substrate doped with first conductive impurities;
   an emitter layer doped with second conductive impurities at an upper portion of the silicon semiconductor substrate, the second conductive impurities having polarities that are opposite polarities of the first conductive impurities, the emitter layer including a first emitter layer heavily doped with the second conductive impurities and a second emitter layer lightly doped with the second conductive impurities, the emitter layer is projected toward a light incident surface of the silicon semiconductor substrate from the upper surface of the silicon semiconductor substrate, wherein lower surfaces of the first and the second emitter layers are positioned on the upper surface of the silicon semiconductor substrate;
   an anti-reflective layer on the emitter layer;
   a plurality of upper electrodes extending in a first direction and connected to the first emitter layer of the emitter layer; and
   a lower electrode connected to a lower portion of the silicon semiconductor substrate,
   wherein the lower surface of the first emitter layer is coplanar with the lower surface of the second emitter layer,
   wherein a surface resistance of the first emitter layer is less than a surface resistance of the second emitter layer,
   wherein the first emitter layer has a lattice shape, the first emitter layer includes a plurality of first portions extending in the first direction and a plurality of second portions extending in a second direction crossing the first direction,
   wherein the plurality of upper electrodes is positioned only on all of the plurality of first portions of the first emitter layer, and the plurality of upper electrodes is not positioned on all of the plurality of second portions of the first emitter layer,
   wherein the anti-reflective layer is not positioned between the plurality of upper electrodes and the plurality of first portions of the first emitter layer, and the anti-reflective layer is positioned directly on the plurality of second portions of the first emitter layer,
   wherein all of the plurality of first portions of the first emitter layer are connected to the plurality of upper electrodes,
   wherein the plurality of second portions of the first emitter layer are connected to the plurality of upper electrodes at a portion crossing the plurality of first portions and the plurality of second portions,
   wherein a width of the first portion and the second portion of the first emitter layer is within a range of 50 µm to 200 µm,
   wherein the surface resistance of the first emitter layer is within a range of 50 Ohm/sq to 120 Ohm/sq,
   wherein an interval between two of the first portions of the first emitter layer is within a range of 1 mm to 3 mm, and an interval between the second portions of the first emitter layer are within a range of 1 mm to 3 mm, and the first portions and the second portions are formed in a lattice shape, and
   wherein the first emitter layer and the second emitter layer contain a same material.

2. The silicon solar cell of claim 1, wherein the second emitter layer is formed by etching a portion of the emitter layer using an etching mask pattern formed by a screen printing method as a mask.

3. The silicon solar cell of claim 1, wherein a width of each of the plurality of upper electrodes is less than the width of the first emitter layer.

4. The silicon solar cell of claim 1, wherein a first distance between adjacent upper electrodes is greater than a second distance between adjacent first portions of the first emitter layer.

5. The silicon solar cell of claim 1, wherein the lower electrode contains aluminum (Al).

6. A silicon solar cell comprising:
   a silicon semiconductor substrate doped with first conductive impurities;
   an emitter layer doped with second conductive impurities at a first portion of the silicon semiconductor substrate, the second conductive impurities having polarities that are different than polarities of the first conductive impurities, the emitter layer including a first emitter layer heavily doped with the second conductive impurities and a second emitter layer lightly doped with the second conductive impurities, wherein a surface resistance of the first emitter layer is less than a surface resistance of the second emitter layer;
   a plurality of first electrodes extending in a first direction and coupled to the first emitter layer;
   a second electrode coupled to a second portion of the silicon semiconductor substrate;
   an anti-reflective layer on the emitter layer,
   wherein the first emitter layer has a lattice shape, the first emitter layer includes a plurality of first portions extending in the first direction and a plurality of second portions extending in a second direction crossing the first direction,
   wherein all of the plurality of first portions of the first emitter layer are positioned on the substrate at a first area corresponding to where all the plurality of first electrodes are provided and all of the plurality of first portions of the first emitter layer are coupled to the plurality of first electrodes, and all of the plurality of second portions of the first emitter layer are positioned on the substrate at a second area away from the first area corresponding to where the plurality of first electrodes are formed, wherein a width of the first portion and the second portion of the first emitter layer is within a range of 50 μm to 200 μm, wherein the surface resistance of the first emitter layer is within a range of 50 Ohm/sq to 120 Ohm/sq, wherein an interval between two of the first portions of the first emitter layer is within a range of 1 mm to 3 mm, and an interval between the second portions of the first emitter layer are within a range of 1 mm to 3 mm, and the first portions and the second portions are formed in a lattice shape, wherein the first emitter layer and the second emitter layer contain a same material, and wherein the plurality of upper electrodes is positioned only on all of the plurality of first portions of the first emitter layer, and the plurality of upper electrodes is not positioned on all of the plurality of second portions of the first emitter layer, wherein the anti-reflective layer is not positioned between the plurality of upper electrodes and the plurality of first portions of the first emitter layer, and the anti-reflective layer is positioned directly on the plurality of second portions of the first emitter layer, wherein the plurality of second portions of the first emitter layer are connected to the plurality of upper electrodes at a portion crossing the plurality of first portions and the plurality of second portions, wherein the emitter layer is projected toward a light incident surface of the silicon semiconductor substrate from the upper surface of the silicon semiconductor substrate, wherein lower surfaces of the first emitter layer and the second emitter layer are positioned on the upper surface of the silicon semiconductor substrate, and wherein the lower surface of the first emitter layer is coplanar with the lower surface of the second emitter layer.

7. The silicon solar cell of claim 6, wherein the second emitter layer is formed by etching a portion of the emitter layer using an etching mask pattern formed by a screen printing method as a mask.

8. The silicon solar cell of claim 6, wherein a width of each of the plurality of first electrodes is less than the width of the first emitter layer.

9. The silicon solar cell of claim 6, wherein a first distance between adjacent first electrodes is greater than a second distance between adjacent first portions of the first emitter layer.

10. The silicon solar cell of claim 6, wherein the second electrode contains aluminum (Al).

* * * * *